United States Patent [19]
Iwamoto et al.

[11] Patent Number: 5,242,504
[45] Date of Patent: Sep. 7, 1993

[54] PHOTOVOLTAIC DEVICE AND MANUFACTURING METHOD THEREFOR

[75] Inventors: Masayuki Iwamoto, Itami; Kouji Minami, Higashiosaka; Toshihiko Yamaoki, Osaka, all of Japan

[73] Assignee: Sanyo Electric Co., Ltd., Osaka, Japan

[21] Appl. No.: 794,424

[22] Filed: Nov. 19, 1991

[30] Foreign Application Priority Data

Nov. 20, 1990 [JP] Japan .................... 2-317101
Apr. 25, 1991 [JP] Japan .................... 3-095757

[51] Int. Cl.⁵ .................... H01L 31/0368; H01L 31/18
[52] U.S. Cl. .................... 136/258; 257/51; 437/4; 437/247; 437/967
[58] Field of Search ............ 136/258 PC; 437/4, 247, 437/967; 357/30 J, 30 K; 257/51

[56] References Cited
U.S. PATENT DOCUMENTS 4,463,028 7/1984 Laude .................... 427/53.1
4,539,431 9/1985 Moddel et al. .................... 136/258

OTHER PUBLICATIONS
Solar Cell Hand Book, pp. 46–47.

Primary Examiner—Aaron Weisstuch
Attorney, Agent, or Firm—Darby & Darby

[57] ABSTRACT

A photovoltaic device, wherein a non-crystalline semiconductor layer of one conductivity type formed on a single crystal or a polycrystalline semiconductor substrate of the opposite conductivity type is annealed thereby to change the non-crystalline semiconductor to a polycrystalline semiconductor, with a pn junction plane formed therebetween. The depth of the junction plane is 500 Å or less from the light incident surface of the polycrystallized semiconductor. Moreover, the light incidence surface can be made uneven by increasing the growth rate of the non-crystalline semiconductor.

20 Claims, 17 Drawing Sheets

FILM THICKNESS OF a-Si
(q),(r) : 3μm
(s),(t) : 4000Å

PHOTOVOLTAIC DEVICE AND MANUFACTURING METHOD THEREFOR

BACKGROUND OF THE INVENTION

1. Field of the Invention

This invention relates to a photovoltaic device to be used as a solar battery or a photo-sensor, etc. and a manufacturing method therefor.

2. Description of Related Art

A gas diffusion method has conventionally been employed to obtain a semiconductor junction, for example, a pn junction in a photovoltaic device such as a solar battery or the like formed of a single crystal material or a polycrystalline material. An example of the gas diffusion method is doping, wherein a single crystalline semiconductor of one conductivity type is placed in an environment containing a dopant impurity element of the other conductivity type a diffusion source, and annealed at high temperatures of about 850°–950° C., whereby the impurity element is diffused into the single crystalline semiconductor. This gas diffusion method is described in detail in Solar Cell Handbook (The Institute of Electrical Engineers of Japan, 1985, pp. 46–47).

Because of the high temperature annealing of the gas diffusion method as described above, a pn junction plane is formed approximately 2000 Å deep from the surface of the single crystal semiconductor. The pn junction plane referred to above is the location where the concentration of the n-type impurities becomes equal to that of the p-type impurities in the semiconductor body. Therefore, in a photovoltaic device having a pn junction formed at a deep location in the semiconductor, most of the charge carriers generated in a relatively shallow depth from the light incidence plane by absorption of the incident light, namely, photo-generated carriers, are lost due to defects in the doping layer, and do not reach the junction plane. Because of this, the conversion efficiency of the photovoltaic device accordingly becomes poor.

Moreover, according to the gas diffusion method described above, the concentration distribution of the impurity element in the vicinity of the pn junction plane changes moderately along the depthwise direction, and therefore the intensity of the internal electric field inside the photovoltaic device becomes small. As a consequence, even if the incident light can reach the junction plane the photo-generated carriers cannot be fully collected due to the low intensity of the internal electric field.

It is known to make the electrode or the semiconductor layer of the photovoltaic device at the light incidence side uneven so as to make more effective use of the incident light. According to this arrangement, the incident light is multi-reflected between the incidence plane of the uneven surface and the back electrode, so that the optical path is elongated. However, since the surface shape of the semiconductor material is not changed as a result of doping of the impurity element in the aforementioned gas diffusion method, the incidence plane has been required to be subjected to a special treatment to be made uneven.

SUMMARY OF THE INVENTION

This invention has been devised to solve the above-described inconveniences.

In a photovoltaic device according to this invention, a non-crystalline semiconductor layer of one conductivity type is formed on a single crystal semiconductor or a polycrystalline semiconductor substrate of the opposite conductivity type and the non-crystalline semiconductor is annealed and polycrystallized, whereby a pn junction plane is obtained. If the thickness of the non-crystalline semiconductor is made small, the junction plane can be formed at a shallow depth (500 Å or less) from the light incidence plane, and the concentration distribution of the dopant impurity element becomes great in the vicinity of the junction plane. As a result, the charge carriers generated by the light incident upon the photovoltaic device of this invention can be separated into electrons and holes with good efficiency and easily outputted. Moreover, if the growth rate of the non-crystalline semiconductor is made large, the surface of the non-crystalline semiconductor can be made uneven through annealing.

OBJECTS OF THE INVENTION

A main object of this invention is therefore to provide a photovoltaic device and a manufacturing method therefor capable of improving the open circuit voltage.

A further object of this invention is to provide a photovoltaic device and a manufacturing method therefor capable of improving the photosensitivity characteristic by making an uneven light incidence plane.

A still further object of this invention is to provide a manufacturing method of a photovoltaic device whereby the presence or absence of an unevenly shaped light incidence plane can be controlled by controlling the growth rate of a non-crystalline semiconductor to be polycrystalized.

A yet further object of this invention is to provide a manufacturing method of a photovoltaic device whereby the grain size of a polycrystalline semiconductor obtained from a non-crystalline semiconductor can be made large by annealing a laminated body consisting of a single crystal semiconductor or polycrystalline semiconductor of one conductivity type, a non-crystalline semiconductor of the opposite conductivity type, and an insulating film.

The above and further objects and features of the invention will more fully be apparent from the following detailed description taken with the accompanying drawings.

DESCRIPTION OF THE PREFERRED EMBODIMENTS

Preferred embodiments of this invention will be discussed hereinbelow with reference to the accompanying drawings.

First Embodiment

Figure 1:
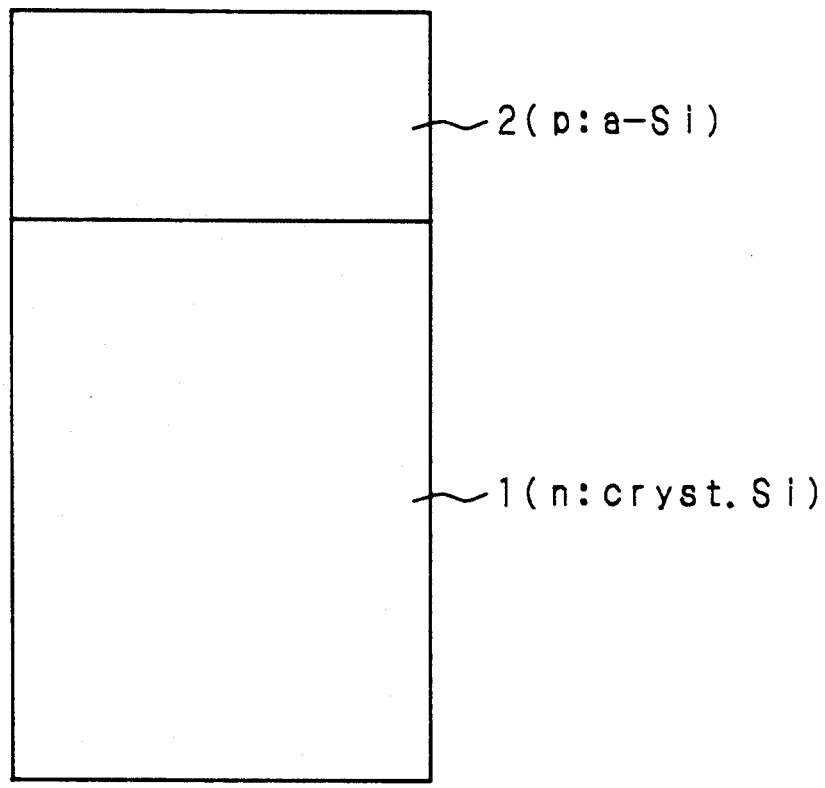
FIGS. 1 and 2 are cross-sectional views showing the structure of a photovoltaic device according to a first embodiment of this invention.

Referring to FIG. 1, in the first step, a non-crystalline semiconductor 2 of one conductivity type, which is p-type amorphous silicon, is formed illustratively by a conventional plasma CVD method on a single crystal semiconductor substrate 1 of the opposite conductivity type, which is illustratively n-type single crystalline silicon. The representative conditions to form a film of the p-type amorphous silicon are shown in Table 1 below. Although diborane ($B_2H_6$) and phosphine ($PH_3$) are used as doping gases, other gases may be used. According to the instant embodiment, the growth rate of the non-crystalline semiconductor 2 (amorphous/silicon) is set to 0.5–15 Å/sec. and the film thickness is approximately 500 Å. Table 1 also shows the conditions to form n-type amorphous silicon semiconductor when the single crystal semiconductor 1 of one conductivity type is a p-type semiconductor and the non-crystalline semiconductor 2 of the opposite conductivity type is n-type amorphous silicon.

TABLE 1

| | P-type amorphous silicon | N-type amorphous silicon |
| --- | --- | --- |
| Flow Rate | | |
| $SiH_4$ (sccm) | 50–100 | 50–100 |
| $B_2H_6$ (sccm) | 0.25–0.5 | — |
| $PH_3$ (sccm) | — | 0.1–0.5 |
| Substrate Temperature (°C.) | 100–400 | 100–400 |
| Discharge power (W) | 50–100 | 50–200 |
| Pressure (Torr) | 0.1–1.0 | 0.5–1.0 |
| Growth rate (Å/sec) | 0.5–30 | 0.5–30 |

Figure 2:
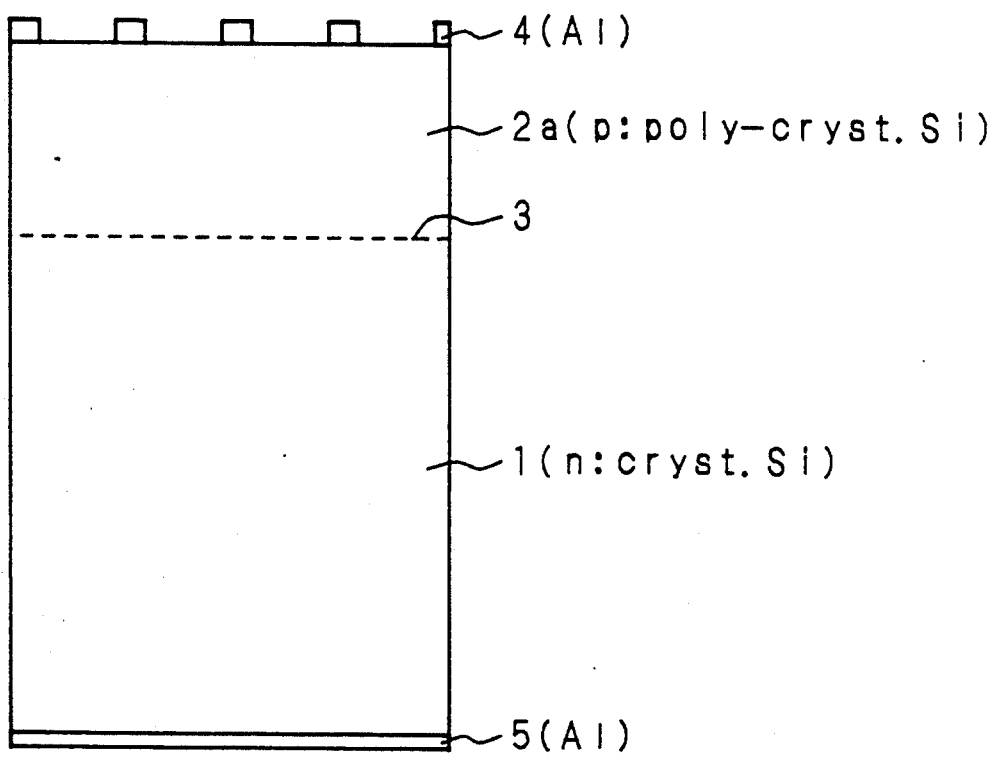

In the second step shown in FIG. 2, the single crystal semiconductor substrate 1 with the non-crystalline semiconductor 2 is annealed for three hours at 650° C. Then, a light incident grid electrode 4 in the shape of the teeth of a comb and a back electrode 5 are formed of metallic aluminum by a deposition method. During the annealing process, the non-crystalline semiconductor 2 is polycrystallized to a p-type polycrystalline silicon semiconductor 2a. At the same time, a pn-junction is obtained between the polycrystalline semiconductor 2a and the single crystal semiconductor substrate 1. The junction plane of the pn junction is designated by reference numeral 3 in FIG. 2.

According to the present embodiment, the junction plane 3 of the pn junction is formed 500 Å below the surface of the polycrystalline semiconductor 2a. This depth corresponds to the film thickness of the non-crystalline semiconductor 2 and therefore, the depth of the junction plane 3 from the surface side can be easily controlled by controlling the film thickness of the non-crystalline semiconductor 2. If it is desired to form the junction plane 3 at a more shallow depth from the surface it is sufficient to merely reduce the film thickness of the non-crystalline semiconductor 2.

Since the polycrystalline semiconductor 2a functions as a semiconductor layer for outputting the photo-generated carriers in the photovoltaic device, the polycrystalline semiconductor 2a should have a low resistance. More specifically, whether the polycrystalline semiconductor 2a is a p-type semiconductor or ann-type semiconductor, the concentration of the charge carriers the polycrystalline semiconductor 2a is desirably $5 \times 10^{20}$–$2 \times 10^{21}$ $cm^{-3}$. Moreover, it is preferable that the annealing temperature be in the range 500°–650° C., and the annealing time 3–7 hours in an inert gas environment or in a vacuum.

Figure 3:
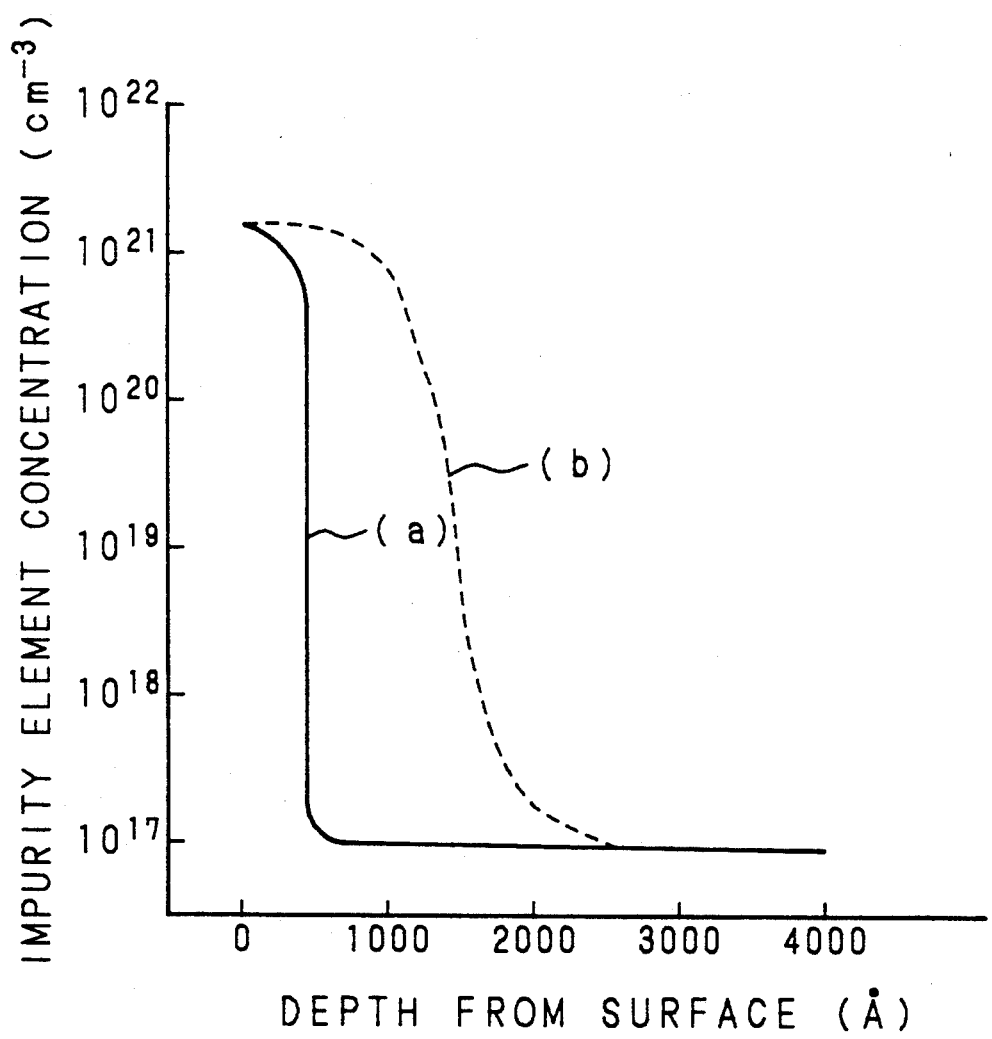
FIG. 3 is a diagram of the concentration distribution of an impurity element in the first embodiment of this invention as compared to a comparison example.

In the photovoltaic device manufactured in the manner as described hereinabove, the concentration distribution of the impurity element in the vicinity of the junction plane 3, which element is diffused from the non-crystalline semiconductor, 2 and determines the conductivity type, assumes a considerably sharp pattern, as is indicated by solid line (a) in FIG. 3. The broken line (b) of FIG. 3 shows the concentration distribution of the impurity element when the pn junction is formed by the conventional gas diffusion method. In FIG. 3, the abscissa and ordinate respectively show the depth from the surface of the polycrystalline semiconductor 2a and concentration of the impurity element. The concentration is determined by a secondary ion mass analyzer. As is clear from the graph, the concentration of the impurity element according to the instant embodiment changes quite abruptly from $1 \times 10^{21}$ cm to $1 \times 10^{17}$ $cm^{-3}$ in a depth range of about 500 Å. In contrast, the equivalent change in concentration of the impurity element according to the conventional gas diffusion method is moderate and gradual, occurring over a wide depth range of about 1500 Å.

It has been also confirmed that in the case where a film of n-type amorphous silicon is formed as the non-crystalline semiconductor 2 on a p-type single crystal semiconductor substrate 1, the concentration distribution of the impurity element is the same as indicated in FIG. 3.

Figure 4:
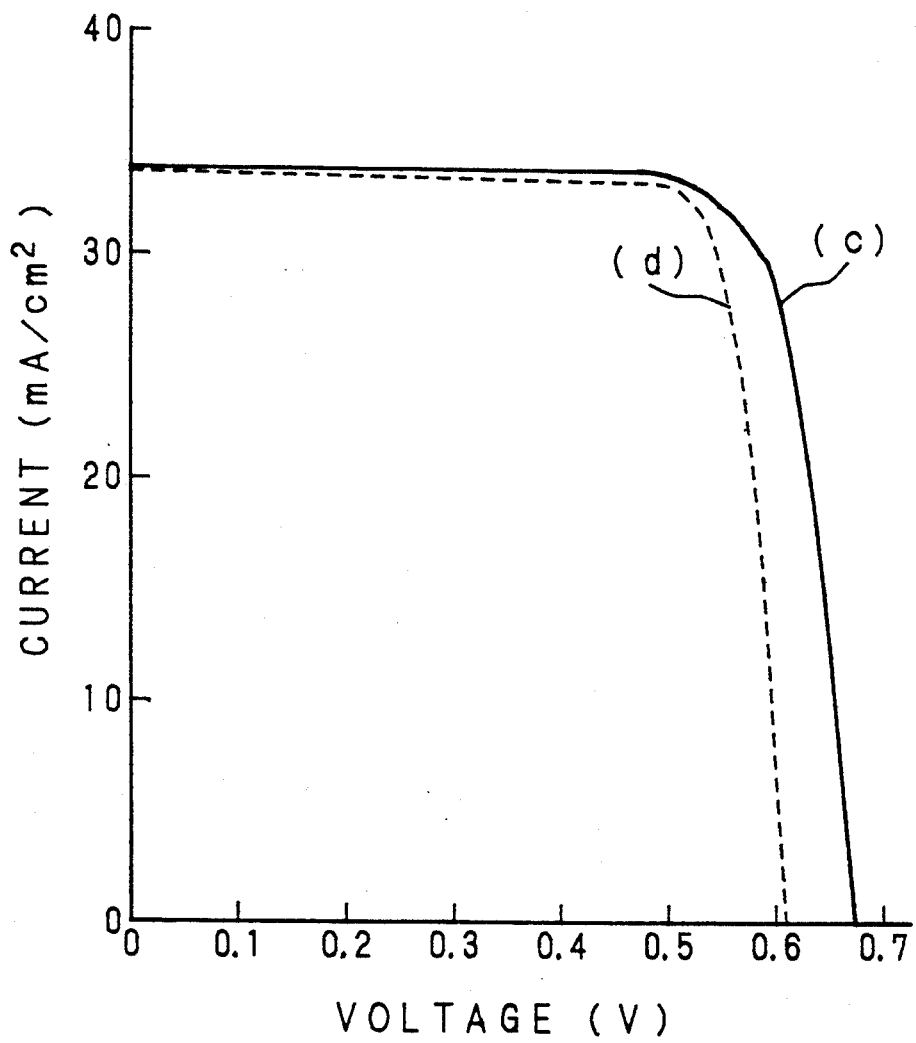
FIG. 4 is a diagram of the photovoltaic characteristic of the first embodiment and the comparison example.
Figure 5:
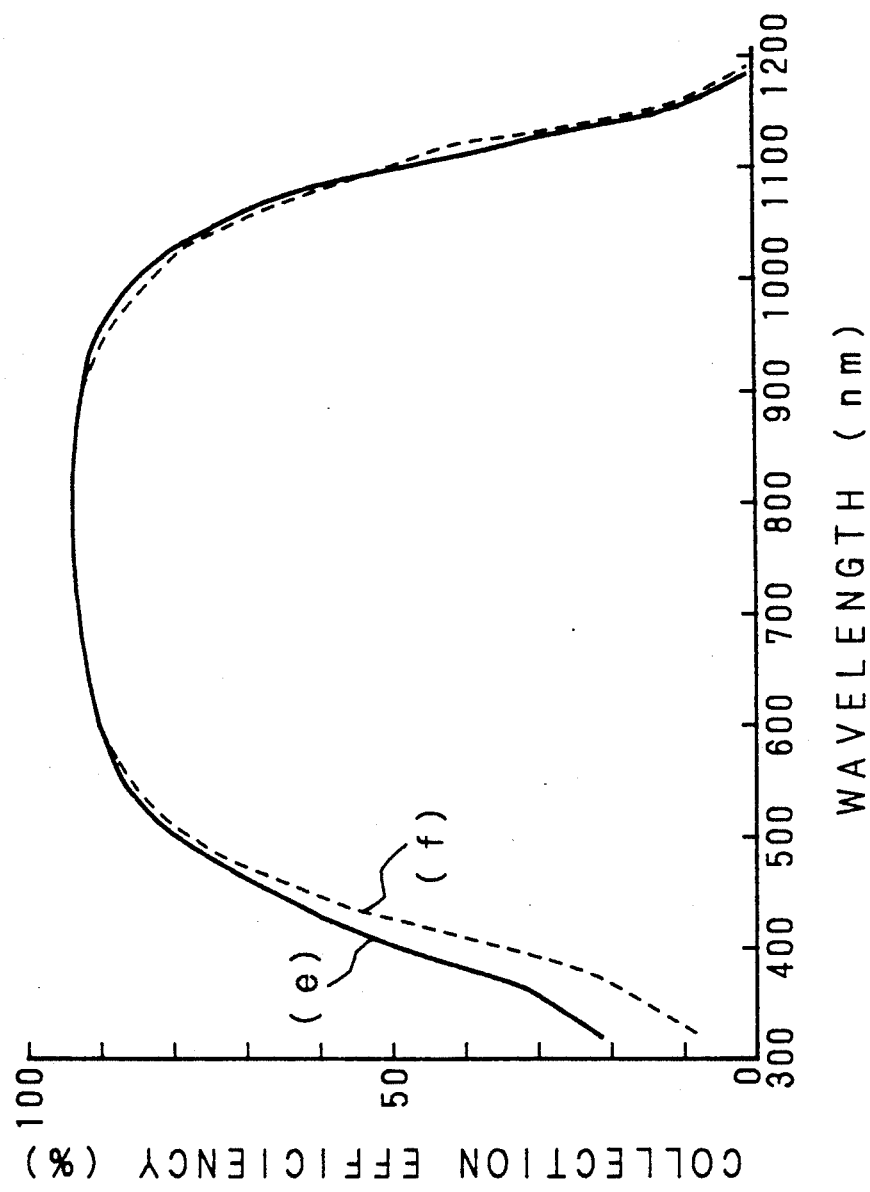
FIG. 5 is a diagram of the photosensitivity characteristic of the first embodiment and the comparison example.

The electrical characteristics of the photovoltaic device of the present embodiment will be discussed below. The photovoltaic and photosensitivity characteristics of the present photovoltaic device are shown in FIGS. 4 and 5, respectively. In FIG. 4, the solid line (c) and the broken line (d) represent the characteristic curves of the present embodiment and the conventional example, respectively, and the abscissa and ordinate indicate the voltage and the current, respectively.

Referring to FIG. 4, the open-circuit voltage of the present embodiment is considerably increased as compared with that of the conventional example. This results from the steep change of the concentration distribution of the impurity element in the vicinity of the junction plane 3 in the present embodiment, and accordingly the photovoltaic device of the present embodiment generates a more effective internal electric field than the conventional example. In FIG. 5, since the junction place 3 is formed at a shallower depth from the surface of the photovoltaic device of the present embodiment in comparison with the conventional example, the shorter wavelength photosensitivity is improved in the range of the shorter wavelengths. However, the longer wavelength photosensitivity is hardly different between the present embodiment and conventional example.

Although the non-crystalline semiconductor 2 is formed on the single crystal semiconductor substrate 1 for annealing according to the first embodiment, the same photovoltaic device can be obtained even if a polycrystalline semiconductor is used in place of the single crystal semiconductor.

Second Embodiment

If the growth rate of the non-crystalline semiconductor 2 (amorphous silicon) is increased to 15–30 Å/sec. or so) as compared to the above first embodiment, the surface of the polycrystalline semiconductor 2a (polycrystalline silicon) after annealing becomes uneven. This is the basis for the second embodiment of this invention. The growth rate of the non. crystalline semiconductor 2 can be easily increased by raising the discharge power or increasing the amount of the reaction gas under the conditions described in Table 1.

Figure 6:
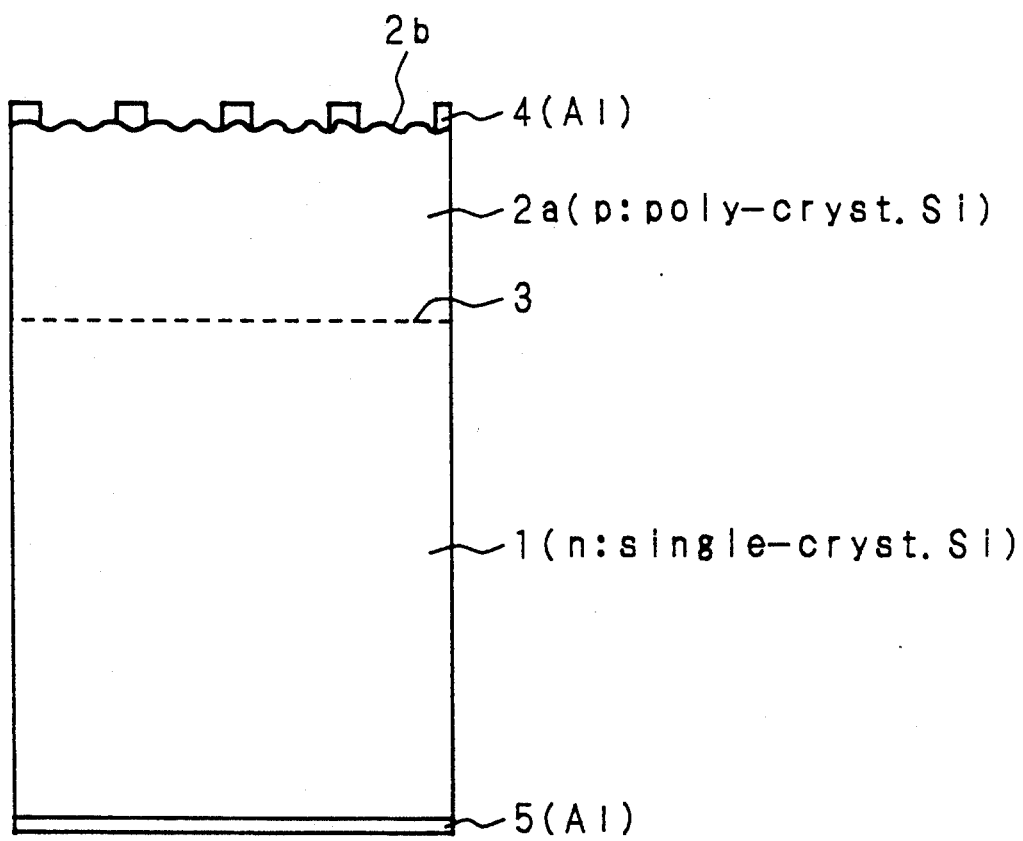
FIG. 6 is a cross sectional view showing the structure of a photovoltaic device according to a second embodiment of this invention.

The structure of the device according to the second embodiment is shown in FIG. 6, in which the same parts as in FIG. 2 are designated by the same numerals. The surface of the polycrystalline semiconductor 2a is changed to an uneven surface 2b.

Figure 7:
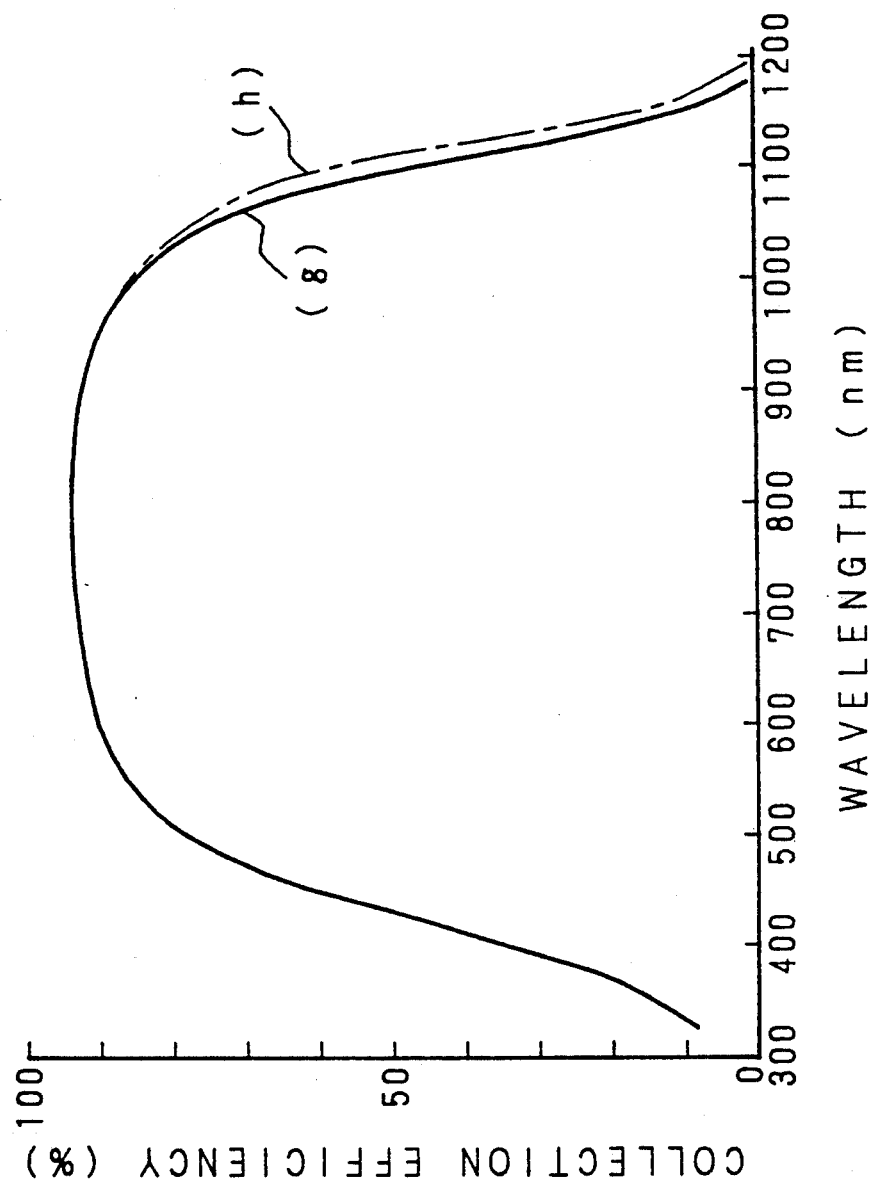
FIG. 7 is a diagram of the photosensitivity characteristic of the first and second embodiments.

The photosensitivity characteristic of the photovoltaic device of the second embodiment of the present embodiment is indicated in the FIG. 7. Solid line (g) of FIG. 7 depicts the characteristic curve of the first embodiment without an uneven surface, when the growth rate of the non-crystalline semiconductor 2 is 10 Å/sec. On the other hand, the one-dot chain line (h) shows the characteristic curve of the second embodiment when the uneven surface 2b is formed with the growth rate of 25 Å/sec. As is understood from FIG. 7, the photosensitivity is greatly improved in the range of the long wavelength side in the second embodiment than in the first embodiment. The reason for this is that since the second embodiment is provided with the uneven surface 2b, the optical path is effectively elongated in the second embodiment.

Third Embodiment

According to a third embodiment, the non-crystalline semiconductor 2 is formed on a polycrystalline semiconductor instead of a single crystal semiconductor 1 as in the second embodiment.

Figure 8:
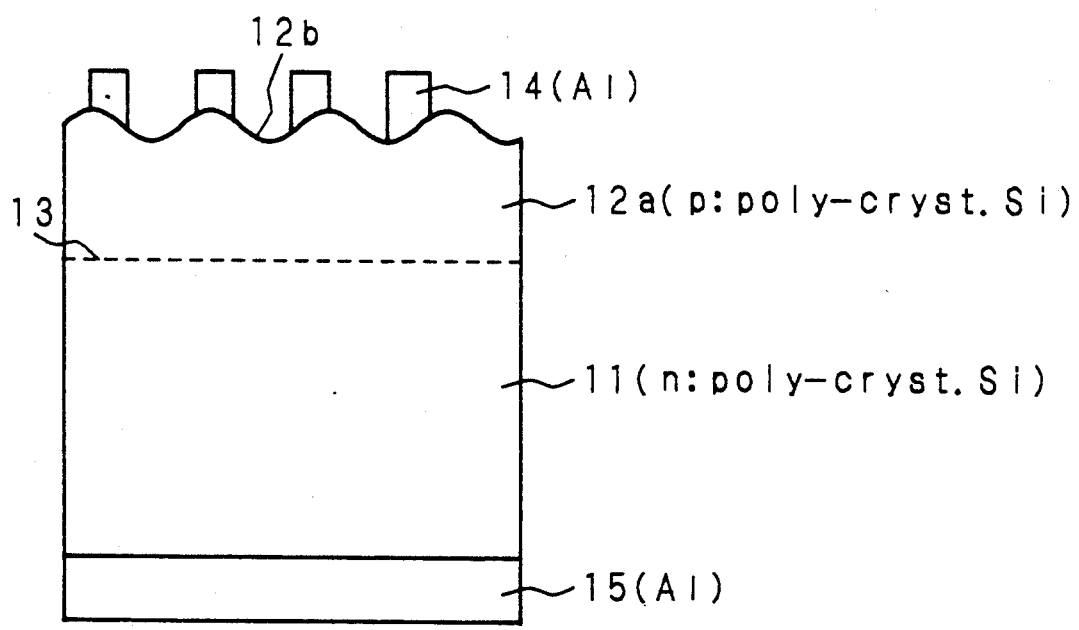
FIG. 8 is a cross sectional view showing the structure of a photovoltaic device according to a third embodiment of this invention.

FIG. 8 shows the structure of the device according to the third embodiment, in which numeral 12a is a polycrystalline semiconductor (p-type polycrystalline silicon) obtained by annealing and polycrystallizing a non-crystalline semiconductor (p-type amorphous silicon) formed on a polycrystalline semiconductor substrate 11 of n type polycrystalline silicon and, numeral 13 is the junction plane of the pn junction. The surface 12b of the polycrystalline semiconductor 12a is uneven. A grid electrode 14 is provided on the light incident surface of the polycrystalline semiconductor 12a in the form of the teeth of a comb, and a back electrode 15 is formed on the polycrystalline semiconductor 11.

In the third embodiment as well as in the second embodiment, it is possible to polycrystallize the non-crystalline semiconductor and make the surface of the non-crystalline semiconductor uneven by annealing. The annealing conditions according to the third embodiment are shown in Table 2 below. It is to be noted here that the non-crystalline semiconductor (amorphous silicon) is formed under the same conditions by the plasma CVD method as in Table 1 of the first embodiment.

TABLE 2

| Temperature (°C.) | 500–700 |
|---|---|
| Annealing time (h.) | 5–20 |
| Ramp rate (°C./sec.) | 0.05–1 |

Figure 9:
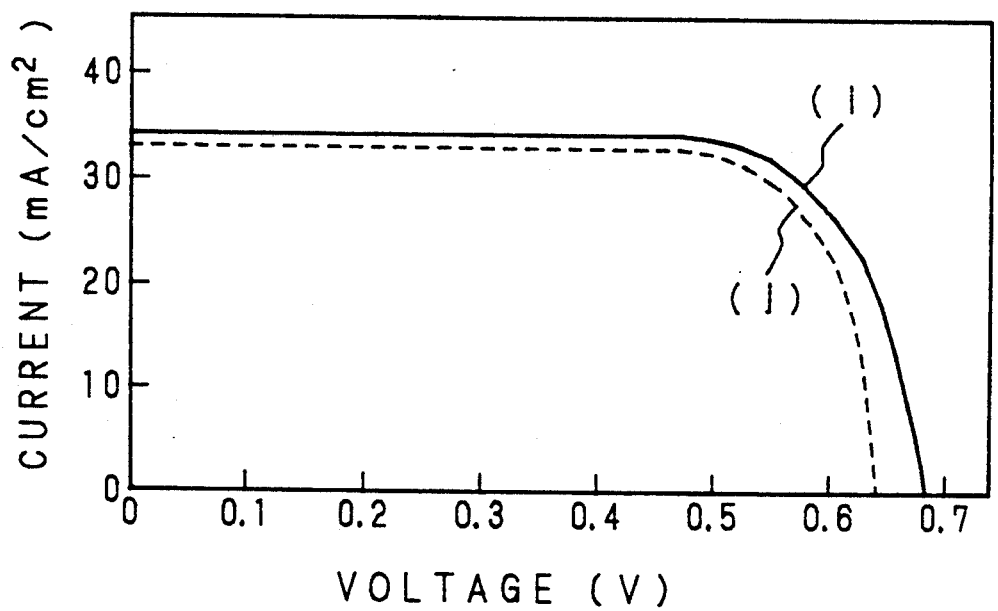
FIG. 9 is a diagram of the photovoltaic characteristic of the third embodiment and a comparison example.
Figure 10:
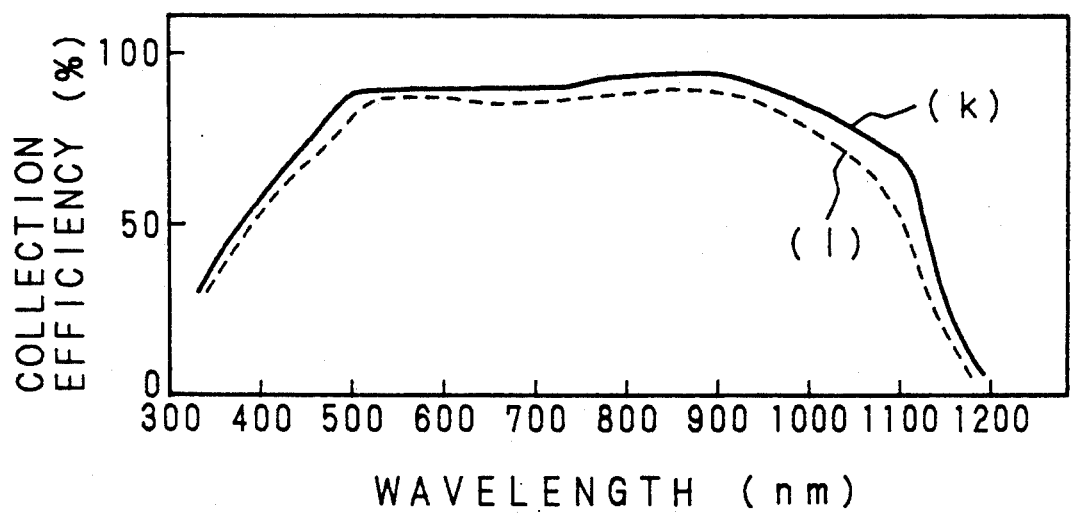
FIG. 10 is a diagram of the photosensitivity characteristic of the third embodiment and the comparison example.

The photovoltaic and photosensitivity characteristics of the third embodiment are shown respectively in FIGS. 9 and 10. Solid lines (i) and (k) in FIGS. 9 and 10, respectively, indicate characteristic curves of the third embodiment, wherein the uneven surface 12b is formed on the non-crystalline semiconductor (amorphous silicon) during its growth at a rate of 15–30 Å/sec. Broken lines (j) and (l) in these drawings indicate characteristic curves of a comparison example (i.e., the first embodiment, using a polycrystalline semiconductor formed without the uneven surface at a growth rate of 1–5 Å/sec.). In FIGS. 9 and 10, as compared with the comparison example, the third embodiment displays a superior photovoltaic characteristic and an improved photosensitivity in the long wavelength range.

Fourth Embodiment

A fourth embodiment of this invention will now be discussed with reference to FIGS. 11 and 12.

Figure 11:
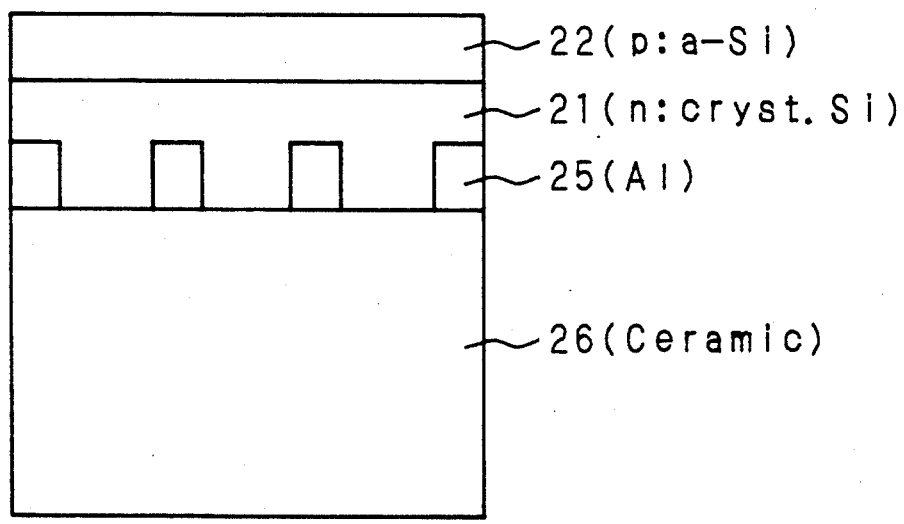
FIGS. 11 and 12 are cross sectional views showing the structure of a photovoltaic device according to a fourth embodiment of this invention.
Figure 12:
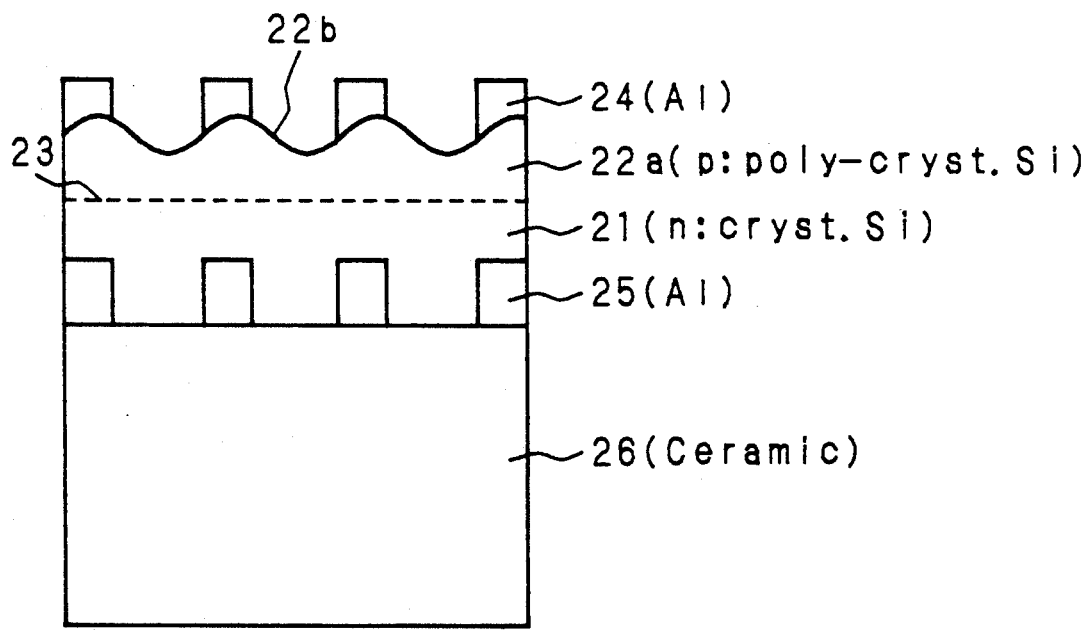

In the first step of FIG. 11, a back electrode 25 of a photovoltaic device is patterned on a ceramic supporting substrate 26, onto which a polycrystalline semiconductor 21 of n-type polycrystalline silicon and a non-crystalline semiconductor 22 of p-type amorphous silicon which is to be annealed in a succeeding process are sequentially formed. The non-crystalline semiconductor 22 (amorphous silicon) is formed in the same method under the same conditions as in the first embodiment, and the polycrystalline semiconductor 21 (polycrystalline silicon) is formed by a thermal CVD method.

Subsequently, in the second step indicted in FIG. 12, the non-crystalline semiconductor 22 is polycrystallized by addition of heat, that is, by annealing, and a grid electrode 24 is formed on the polycrystallized semiconductor 22, namely, polycrystalline semiconductor 22a. According to the fourth embodiment, the polycrystalline semiconductor 22a is formed of polycrystalline silicon, the surface of which is formed to be the uneven surface 22b. Reference numeral 23 in FIG. 12 indicates the junction plane of the pn junction.

Figure 13:
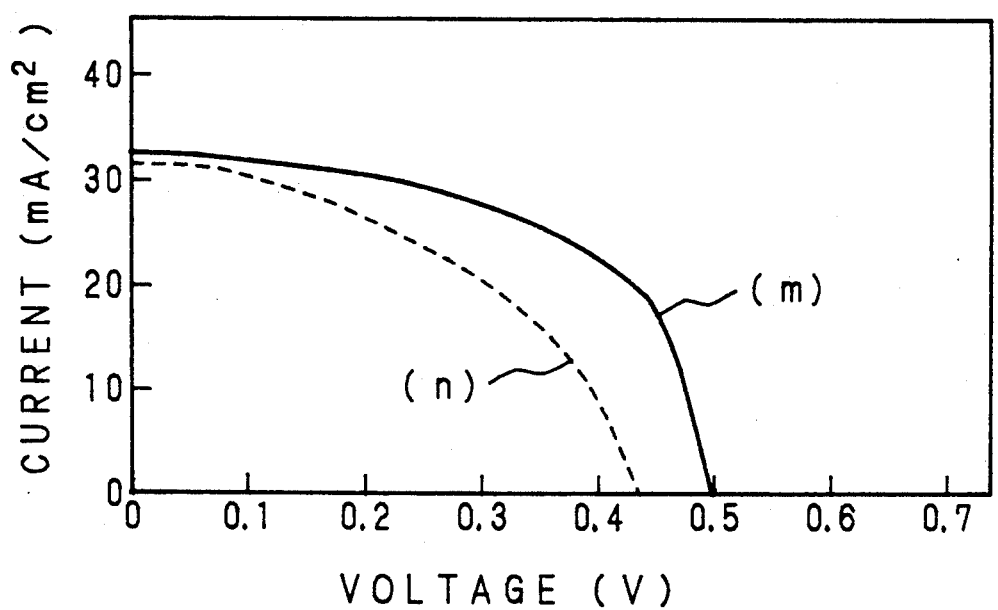
FIG. 13 is a diagram of the photovoltaic characteristic of the fourth embodiment and a comparison example.
Figure 14:
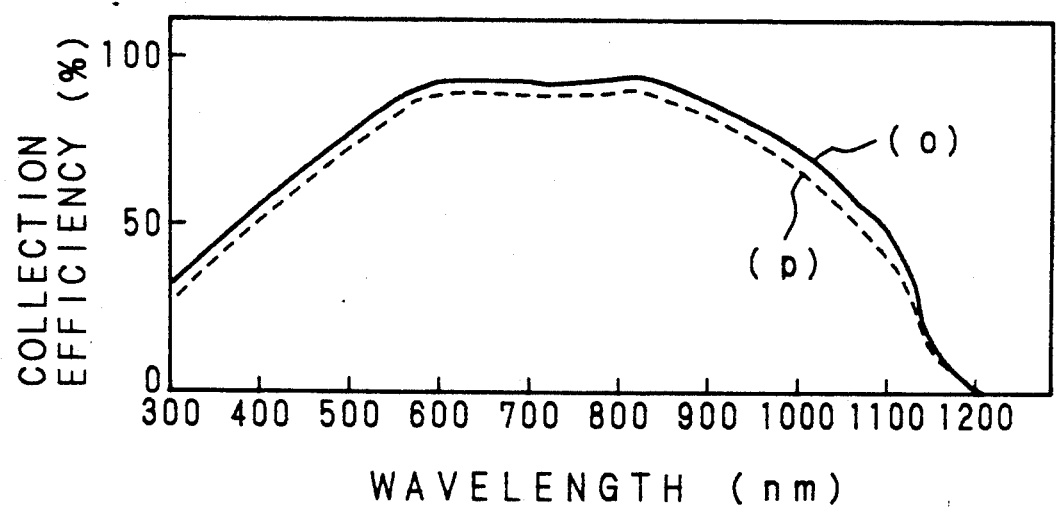
FIG. 14 is a diagram of the photosensitive characteristic in the fourth embodiment and the comparison example.

FIGS. 13 and 14 show the photovoltaic and photosensitivity characteristics of the photovoltaic device of the fourth embodiment, specifically, solid lines (m) and (o) in FIGS. 13 and 14 indicate the characteristic curves of the fourth embodiment with the uneven surface 22b when the growth rate of the non-crystalline semiconductor 22 is increased, while broken lines (n) and (p) are characteristic curves of a comparison example in which the growth rate of the non-crystalline semiconductor 22 is decreased, thus not forming an uneven surface. The photovoltaic device of the fourth embodiment with the uneven surface 22b is, as is made clear from FIGS. 13 and 14 by comparison with the comparison example, superior in photovoltaic characteristic and improved photosensitivity in the long wavelength range.

Besides ceramic materials such as quartz, glass and metal can be used for the supporting substrate 26.

Furthermore, although a non-crystalline semiconductor 22 is formed and annealed on the polycrystalline semiconductor 21 in the above embodiment, it is possible to employ a single crystal semiconductor in place of the polycrystalline semiconductor to achieve the same effect.

Fifth Embodiment

Figure 15:
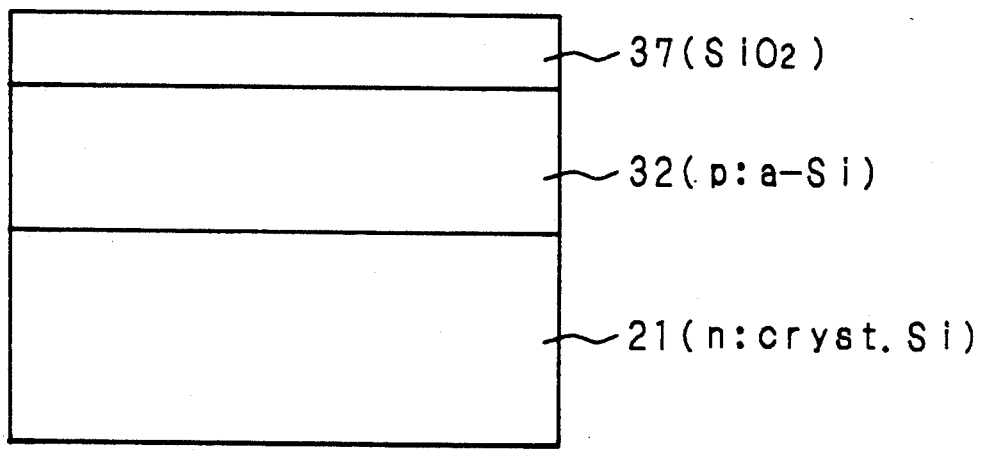
FIGS. 15 and 16 are cross sectional views showing the structure of a photovoltaic device according to a fifth embodiment of this invention.
Figure 16:
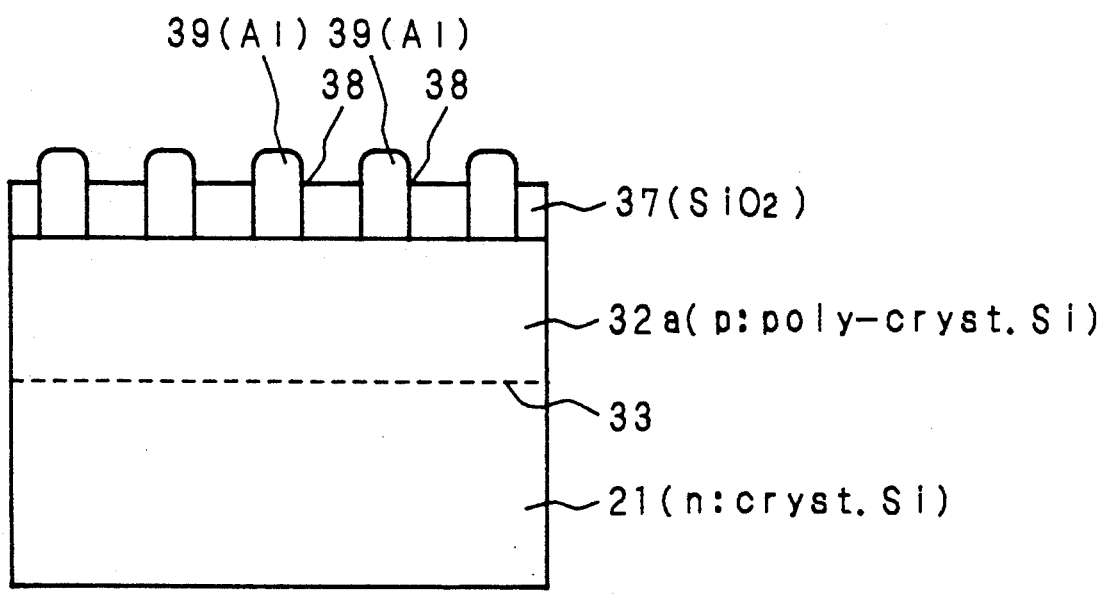

Referring now to FIGS. 15 and 16, a photovoltaic device according to a firth embodiment of this invention is described. In the first step of FIG. 15, a non-crystalline semiconductor 32 of p-type amorphous silicon is formed onto a single crystal semiconductor 31 of n-type single crystalline silicon by a plasma CVD method, and an insulating film 37 of silicon oxide is further formed on the non-crystalline semiconductor 32 by a plasma CVD method or a low-pressure CVD method. In the second step shown in FIG. 16, after the non-crystalline semiconductor 32' (p-type amorphous silicon) is treated by annealing at 650° C. to be a polycrystalline semiconductor 32a (p-type polycrystalline silicon), a plurality of apertures 38 are formed in the insulating film 37. A metallic film 39 of aluminum is formed in each of the apertures 38, thereby forming an electrode. Reference numeral 33 is the junction plane of the pn junction in FIG. 16. Accordingly, the pn junction is achieved at the contact between the single crystal semiconductor 31 and polycrystalline semiconductor 32a during the annealing treatment in the second step, thus constituting the basic structure of the photovoltaic device.

According to the fifth embodiment, since insulating film 37 is formed on the upper surface of the non-crystalline semiconductor 32 to be polycrystallized, polycrystallization is difficult to occur at the side of the insulating film 37 (at the upper surface side of the non-crystalline semiconductor 32), but it spreads mainly from the side of the single crystal semiconductor 31 (i.e., the lower surface side of the non-crystalline semiconductor 32). Therefore, in comparing the present embodiment with the case where no insulating film is formed, although it takes more time to polycrystallize the non-crystalline semiconductor 32, it becomes possible to obtain a polycrystalline semiconductor 32 with larger sized grains.

Figure 17:
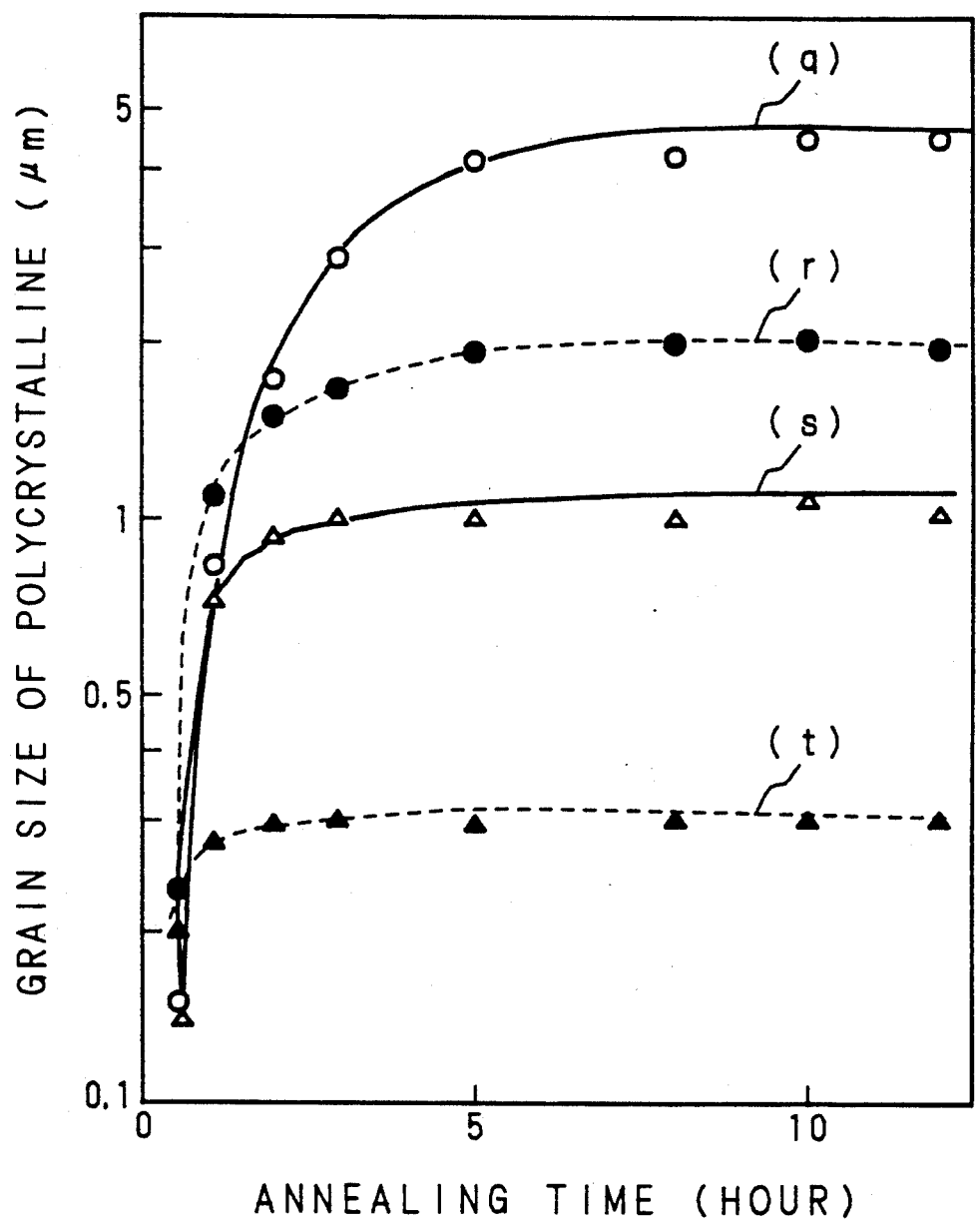
FIG. 17 is a characteristic diagram of the grain size of a polycrystalline semiconductor of the fifth embodiment and a comparison example.

FIG. 17 shows the relation between the annealing time and the grain size of the polycrystalline semiconductor 32a according to the fifth embodiment. In FIG. 17, solid lines (q) and (s) indicate characteristic curves of the fifth embodiment where the non-crystalline semiconductor 32 (amorphous silicon) is coated with the insulating film 37 before polycrystallization, while broken lines (r) and (t) show characteristic curves of a comparison example wherein the amorphous silicon is polycrystallized without an insulating film. Moreover, the solid line (q) and broken line (r) depict the case when the film thickness of the amorphous silicon to be polycrystallized is 3 μm, and the solid line (s) and broken line (t) indicate the case when the film thickness of the amorphous silicon is 4000 Å. As is understood from FIG. 17, the annealing time becomes longer due to the insulating film 37, but the grain size is increased.

Although a silicon oxide film is employed as the insulating film 37 in the above embodiment, a silicon nitride film may also be used.

Further, although the non-crystalline semiconductor 32 is formed and annealed on a single crystal semiconductor 31 in the fifth embodiment, the same photovoltaic device as above can be obtained even if the single crystal semiconductor 31 is replaced with a polycrystalline semiconductor.

In addition, although the foregoing description of the embodiments is directed to cases where the single crystal semiconductor or polycrystalline semiconductor is of n-type and the non-crystalline semiconductor to be a polycrystallized is of p-type, the conductivity types may be reversed.

As this invention may be embodies in several forms without departing from the spirit of the essential characteristics thereof, the present embodiments are therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A photovoltaic device, comprising:
   a single crystal semiconductor substrate of one conductivity type;
   a polycrystalline semiconductor obtained by annealing a non-crystalline semiconductor of the opposite conductivity type formed on said single crystal semiconductor; and
   a junction plane formed by said annealing process between said single crystal semiconductor and said polycrystalline semiconductor at a depth of 500 Å or less from the surface of said polycrystalline semiconductor.

2. A photovoltaic device according to claim 1, wherein said non-crystalline semiconductor is amorphous silicon.

3. A photovoltaic device, comprising:
   a single crystal semiconductor substrate of one conductivity type;
   a polycrystalline semiconductor obtained by annealing a non-crystalline semiconductor of the opposite conductivity type formed on said single crystal semiconductor and which has an upper, light incident uneven surface; and
   a junction plane formed by said annealing process between said single crystal semiconductor and said polycrystalline semiconductor.

4. A photovoltaic device according to claim 3, wherein said junction plane is formed at a depth of 500 Å or less from the surface of said polycrystalline semiconductor.

5. A photovoltaic device, comprising:
   a first polycrystalline semiconductor substrate of one conductivity type;
   a second polycrystalline semiconductor formed by annealing a non-crystalline semiconductor of the opposite conductivity type formed on said first polycrystalline semiconductor; and a junction plane formed by said annealing process between said first polycrystalline semiconductor and said second polycrystalline semiconductor at a depth of 500 Å or less from the surface of said second polycrystalline semiconductor.

6. A photovoltaic device according to claim 5, wherein said non-crystalline semiconductor is amorphous silicon.

7. A photovoltaic device, comprising:
a first polycrystalline semiconductor substrate of one conductivity type;
a second polycrystalline semiconductor which is obtained by annealing a non-crystalline semiconductor of the opposite conductivity type formed on said first polycrystalline semiconductor and which has an uneven surface; and
a junction plane formed by said annealing process between said first polycrystalline semiconductor and said second polycrystalline semiconductor.

8. A photovoltaic device according to claim 7, wherein said junction plane is formed at a depth of 500 Å or less from the surface of said second polycrystalline semiconductor.

9. A method for manufacturing a photovoltaic device, comprising the steps of:
growing a non-crystalline semiconductor of one conductivity type on a single crystal semiconductor of the opposite conductivity type; and
annealing said non-crystalline semiconductor to polycrystallize and non-crystalline semiconductor and make the surface of the polycrystallized semiconductor uneven.

10. A photovoltaic device according to claim 9, wherein said non-crystalline semiconductor is amorphous silicon, the growth rate of which is 15–30 Å/sec.

11. A method for manufacturing a photovoltaic device, comprising the steps of:
forming a patterned first electrode on a substrate;
forming a single crystal semiconductor layer of one conductivity type on said substrate including said first electrode;
forming a non-crystalline semiconductor layer of the opposite conductivity type on said single crystal semiconductor;
annealing said non-crystalline semiconductor to change said non-crystalline semiconductor to a polycrystalline semiconductor and make the upper, light incident surface of said polycrystalline semiconductor uneven; and
forming a patterned second electrode on said polycrystalline semiconductor.

12. A method for manufacturing a photovoltaic device according to claim 11, wherein said substrate is selected from the group consisting of ceramic, quartz, glass, and metal.

13. A method for manufacturing a photovoltaic device, comprising the steps of:
forming a non-crystalline semiconductor layer of one conductivity type on a single crystal semiconductor substrate of the opposite conductivity type;
forming an insulating film on said non-crystalline semiconductor; and
annealing said non-crystalline semiconductor thereby to change said non-crystalline semiconductor to a polycrystalline semiconductor and form a semiconductor junction plane.

14. A method for manufacturing a photovoltaic device according to claim 13, further comprising:
forming at least one aperture in said insulating film; and
forming an electrode in said at least one aperture.

15. A method for manufacturing a photovoltaic device, comprising the steps of:
growing a non-crystalline semiconductor layer of one conductivity type on a polycrystalline semiconductor substrate of the opposite conductivity type; and
annealing said non-crystalline semiconductor to polycrystalline said non-crystalline semiconductor and make the surface of the polycrystallized semiconductor uneven.

16. A photovoltaic device according to claim 15, wherein said non-crystalline semiconductor is amorphous silicon, the growth rate of which is 15–30 Å/sec.

17. A method for manufacturing a photovoltaic device, comprising the steps of:
forming a patterned first electrode on a substrate;
forming a first polycrystalline semiconductor layer of one conductivity type on said substrate including said first electrode;
forming a non-crystalline semiconductor of the opposite conductivity type on said first polycrystalline semiconductor;
annealing said non-crystalline semiconductor to change said non-crystalline semiconductor to a second polycrystalline semiconductor and make the surface of said second polycrystalline semiconductor uneven; and
forming a patterned second electrode on said second polycrystalline semiconductor.

18. A method for manufacturing a photovoltaic device according to claim 17, wherein said substrate is selected from the group consisting of ceramic, quartz, glass and metal.

19. A method for manufacturing a photovoltaic device, comprising the steps of:
forming a non-crystalline semiconductor layer of one conductivity type on a first polycrystalline semiconductor of the opposite conductivity type;
forming an insulating film on said non-crystalline semiconductor; and
annealing said non-crystalline semiconductor to change said non-crystalline semiconductor to a second polycrystalline semiconductor and form a semiconductor junction plane.

20. A method for manufacturing a photovoltaic device according to claim 19, further comprising the steps of:
forming at least one aperture in said insulating film; and
forming an electrode in said at least one aperture.

* * * * *